(12) United States Patent
Natuzzi et al.

(10) Patent No.: US 8,543,889 B2
(45) Date of Patent: Sep. 24, 2013

(54) METHOD OF LIST DECODING AND RELATIVE DECODER FOR LDPC CODES

(75) Inventors: Mauro Natuzzi, Piacenza (IT); Angelo Poloni, Fino del Monte (IT); Stefano Valle, Milan (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 306 days.

(21) Appl. No.: 13/171,716

(22) Filed: Jun. 29, 2011

(65) Prior Publication Data

US 2011/0320916 A1 Dec. 29, 2011

(30) Foreign Application Priority Data

Jun. 29, 2010 (IT) .............................. VA2010A0050

(51) Int. Cl.
*H03M 13/00* (2006.01)
(52) U.S. Cl.
USPC .......................................... 714/758; 714/774
(58) Field of Classification Search
USPC ................................................. 714/758, 774
See application file for complete search history.

(56) References Cited

U.S. PATENT DOCUMENTS

| | | | | |
|---|---|---|---|---|
| 6,789,227 B2* | 9/2004 | De Souza et al. | ............ | 714/804 |
| 2009/0013237 A1* | 1/2009 | Lin et al. | ....................... | 714/758 |
| 2009/0063931 A1* | 3/2009 | Rovini et al. | .................. | 714/758 |
| 2009/0106622 A1* | 4/2009 | Yokokawa et al. | ............ | 714/752 |
| 2010/0088575 A1* | 4/2010 | Sharon et al. | ................. | 714/763 |

OTHER PUBLICATIONS

Davey et al., "Low-density parity-check codes of GF(q)", IEEE Communications Letter, vol. 2, No. 6, Jun. 2008, pp. 165-167.
Wymeersch et al., "Log-domain decoding of LDPC codes over GF(q)", IEEE International Conference on Communications, 2004, pp. 772-776.
Song et al., "Reduced-complexity decoding of q-ary LDPC codes for magnetic recording", IEEE Transactions on Magnetics, vol. 39, No. 2, 2003, pp. 1-7.
Voicila et al., "Low-complexity, low-memory LEMS algorithm for non-binary LDPC codes", IEEE International Conference on Communications, 2007, pp. 1-6.
Chang et al., "Performance and decoding complexity of nonbinary LDPC codes for magnetic recording", IEEE Transaction on Magnetics, vol. 44, No. 1, Jan. 2008, pp. 211-216.
Declercq et al., "Decoding algorithms for nonbinary LDPC codes over GF(q)", IEEE Transactions on Communication, vol. 55, No. 4, Apr. 2007, pp. 633-643.

(Continued)

*Primary Examiner* — M. Mujtaba K Chaudry
(74) *Attorney, Agent, or Firm* — Allen, Dyer, Doppelt, Milbrath & Gilchrist, P.A.

(57) ABSTRACT

A method is for generating, for each check node related to a parity check equation of a LDPC code, signals representing a first output table of corrected values of symbols of a word received through a communication channel and transmitted according to the LDPC code, and signals representing a second output table of the logarithm of the ratio between the respective probability of correctness of the values of same coordinates in the first output table and their corresponding maximum probability of correctness. The method is implemented by processing the components of a first input table of values of a Galois Field of symbols that may have been transmitted and of a second input table of corresponding probability of correctness of each value.

13 Claims, 8 Drawing Sheets

(56) References Cited

OTHER PUBLICATIONS

Zarkeshvari et al., "On implementation of min-sum algorithm for decoding low-density parity-check (LDPC) codes", Global Telecommunications Conference, IEEE, vol. 2, Nov. 2002, pp. 1349-1353.

Hocevar, "A reduced complexity decoder architecture via layered decoding of LDPC codes", IEEE Workshop on Signal Processing Systems, Oct. 2004, pp. 107-112.

Liao et al., An O(qlogq) log-domain decoder for non-binary LDPC over GF(q), IEEE Circuits and Systems, Nov. 2008, pp. 1644-1647.

\* cited by examiner (continue on FIG. 5B)

METHOD OF LIST DECODING AND RELATIVE DECODER FOR LDPC CODES

FIELD OF THE INVENTION

This invention relates to decoding digital communications, and, more particularly, to a method of generating signals corresponding to a first output table of corrected values of symbols of a word transmitted according to a LDPC code and a second output table representing the corresponding probability values, and a LIST decoder that implements it.

BACKGROUND OF THE INVENTION

Low Density Parity Check (LDPC) coding is an Error Correction Code (ECC) technique that is being increasingly regarded as a valid alternative to Turbo Codes. LDPC codes have been incorporated into the specifications of several real systems, and the LDPC decoder may turn out to constitute a significant portion of the corresponding digital transceiver.

Non-Binary Low Density Parity Check (LDPC) codes are defined by a sparse parity check matrix $\overline{H}$ in a finite Galois field $GF(2^P)$. The check matrix $\overline{H}$ include a number M of rows, equal to the number of parity check nodes, and a number N of columns, equal to the number of symbols of each received word (codeword). The value of each symbol of a codeword belongs to the Galois field $GF(2^P)$ and is represented by a string of p bits.

Every valid codeword $\overline{c}$ that may be transmitted satisfies the following check equation in the Galois field $GF(2^P)$:

$$\overline{H} \cdot \overline{c} = \overline{0}$$

with $\overline{c}$ being a column vector and $\overline{0}$ a null column vector, whilst invalid codewords do not satisfy it. More specifically, the code is described by a set of j=0, ... nc−1 parity check equations:

$$\sum_{i \in VC(j)} H_{ji} \cdot c_i = 0 \Rightarrow \overline{H} \cdot \overline{c} = 0$$

where both the codeword symbols $c_i$ and the parity check coefficients $H_{ji}$ belong to the $GF(2^P)$ and VC(j) is the set of variables (symbols $c_i$) involved in the j-th check.

The transmitter transmits a valid codeword $\overline{c}$ over a noisy channel. Alternatively, the valid codeword can be written on a storage support (like the magnetic disk of a Hard Disk Drive). The receiver receives a noisy and distorted signal $\overline{r}$ representing a stream of symbols $\overline{c}$. The receiver is capable of delivering a first probabilistic estimate of the transmitted symbols through the PMF (Probability Mass Function) by means of a demodulator or a detector that are not part of the invention. The PMF are the probability that a received symbol $X_i$ is equal to one of the possible symbol over $GF(2^P)$: $P(X_i = \phi_q)$ $\phi_q \in GF(2^P)$. The stream of most likely received symbols is $\hat{x} = [\hat{X}_0, \hat{X}_1, \ldots \hat{X}_N]$ $$\hat{X}_i = \underset{q}{\operatorname{argmax}} P(X_i = \varphi_q).$$

As contemplated in LDPC coding, the product of the check matrix $\overline{H}$ by the received word $\overline{x}$ is performed. Because of noise and channel distortion, the result of this product is generally not the null vector:

$$\overline{H} \cdot \overline{x} = \overline{z} \neq \overline{0}$$

thus the receiver may determine which codeword has been received by implementing an appropriate decoding technique based on properties of LDPC codes. The a posteriori probability that a codeword $\overline{c}$ has been transmitted when a generic signal $\overline{r}$ has been received is computed taking into account the code constraint.

More specifically, LDPC are decoded by means of a belief propagation algorithm that is described in the following paragraphs. The symbols are characterized by the PMF (Probability Mass Function). In the preferred embodiment PMF are represented in the log-domain:

$$\Lambda_{iq} = -\log(P(X_i = \phi_q)) \; \phi_q \in GF(2^P)$$

Using the vector representation $$\Lambda_i = [\Lambda_{i0}, \Lambda_{i1}, \ldots \Lambda_{i q-1}]$$

The full complexity algorithm to be used as reference is the log-domain symbol based belief propagation and is calculated as $$\Lambda_{iq} = -\log(P(X_i = \varphi_q)) \; \forall \, i = 0, \ldots nv \; \forall \, q = 0, \ldots 2^P - 1$$

for $k = 1 : N_{ite}$ for $j = 1 : nc$ for $i \in VC(j)$ $Q_{ij} = \Lambda_i - R_{ji} \forall \, q = 0, \ldots 2^P - 1$ $R_{ji} = SPC(H_j, Q_{ij}) \forall \, q = 0, \ldots 2^P - 1$ $\Lambda_i = Q_{ij} + R_{ji}$ $$\hat{X}_i = \underset{q}{\operatorname{argmax}}(\Lambda_{iq})$$

where $Q_{ij}$, $R_{ji}$ represent the variable to check and the check to variable messages (vectors each including a single PMF relative to the i-th symbol). In a preferred embodiment the belief propagation is implemented with the layered schedule (Dale E. Hocevar, "A reduced complexity decoder architecture via layered decoding of LDPC Codes", IEEE Workshop on Signal Processing Systems (SIPS), October 2004, pp. 107-112).

The check node processing (CNP) is performed by the SPC function. This is the most computational intensive part of the decoding algorithm. It is worth reviewing the approaches proposed so far for the decoding of Non Binary LDPC.

M. C. Davey and D. MacKay, "Low-density parity-check codes over GF(q)", IEEE Commun. Lett., vol. 2, no. 6, pp. 165, that first introduced the use of Non binary LDPC, proposed a very general implementation of the belief propagation (called also Sum Product Algorithm). It works in the probability domain. It has been noted very soon that this it has stability problems when probability values are represented in finite digit. Moreover, its complexity increases as the square of the size of the Galois field $2^P$.

Henk Wymeersch, Heidi Steendam and Marc Moeneclaey "Log-domain decoding of LDPC codes over GF (q)" Proc. IEEE International Conference on Communications, proposed the Sum Product Algorithm in logarithm domain. Its complexity increases as the square of the size of the Galois field $2^P$. The log domain is the preferred embodiment also for the present invention.

H. Song and J. R. Cruz, Reduced-complexity decoding of q-ary LDPC codes for magnetic recording," IEEE Trans. Magn., vol. 39, no. 2, pp. 1081, introduced the SPC processing with the forward-backward approach describe below. Moreover they proposed Q-ary LDPC decoding using Fast Fourier Transform (FFT), both in probability and in logarithm domains. Unfortunately, probability domain gives instability problem when finite representation is used and the FFT in the logarithm domain involves doubling the used quantities. The advantage of using FFT approach is therefore is lost.

A. Voicila, D. Declereq, F. Verdier, M. Fossorier, P. Urard, "Low-complexity, Low-memory EMS algorithm for non-binary LDPC codes" IEEE International Conference on Communications, 2007, ICC '07, proposed the so-called Extended Min Sum algorithm: this very generic approach introduces the concept of reduction of candidates at the input of the SPC but does not provide a computationally simple and effective way to perform the CNP.

Therefore, there is the need for a simpler and faster algorithm usable for decoding non-binary LDPC codes, especially in the most computationally intensive part that is the SPC.

The exact formulation of the SPC is the following:

$$R_{jip} = SPC(H_j, Q_{ij}) = -\log(P(X_i = \varphi_p)) \text{ s.t. } \sum_{i \in VC(j)} H_{ji} X_i = 0$$

The straight-forward approach to solve the SPC is based on the forward-backward recursion over a fully connected trellis with $q=2^p$ states (see for example H. Song and J. R. Cruz, Reduced-complexity decoding of q-ary LDPC codes for magnetic recording," IEEE Trans. Magn., vol. 39, no. 2, pp. 1081 where the same approach is introduce in the probability domain).

States correspond to the symbols Xi. The branches are given by $Q_{ijp}$ and the state connections are determined by the parity check coefficients.

The forward recursion for a generic parity check equation with coefficients $H_t$ where the inputs PMF are $Q_{tp}=-\log(P_{in}(X_t=\phi_p))$ is given by:

$$a_i(z) = -\log(P(state_t = \varphi_z)) = \max_{n=0, \ldots q-1} * (a_{t-1}(n) - \log(P_{in}(X_t = H_t^{-1} \cdot (\varphi_z - \varphi_n))))$$

Backward recursion is defined analogously. The combining step is given by $$R_{tz} = -\log(P(X_t = \varphi_z)) = \max_{\substack{n=0, \ldots q-1 \\ m=0, \ldots q-1}} * (a_{t-1}(n) + \beta_{t+1}(m)) \text{ s.t. } H_t^{-1}(\varphi_n + \varphi_m) = \varphi_z$$

The straightforward approximation available at the Check Node Processing is the substitution of the max* operator with the max. In order to compensate the well-known overestimation of the max operator a proper scaling factor is applied at the SPC output so that the recursion is given by:

$$a_t(z) = \max_{n=0, \ldots q-1} (a_{t-1}(n) - \log(P_{in}(X_t = H_t^{-1} \cdot (\varphi_z - \varphi_n))))$$

and the combining is $$R_{tz} = \gamma \cdot \max_{\substack{n=0, \ldots q-1 \\ m=0, \ldots q-1}} (a_{t-1}(n) + \beta_{t+1}(m)) \text{ s.t. } H_t^{-1}(\varphi_n + \varphi_m) = \varphi_z$$

where the scaling factor γ is—in the context of magnetic recording—about 0.75.

This algorithm is the natural extension of the normalized min-sum belief propagation in the binary field (Zarkeshvari, F.; Banihashemi, A. H.; "On implementation of min-sum algorithm for decoding low-density parity-check (LDPC) codes", Global Telecommunications Conference, 2002. GLOBECOM '02. IEEE Volume 2, 17-21 November 2002 Page(s): 1349-1353.).

In order to further simplify the decoding algorithm, both input and SPC processing can be restricted to a subset of symbol candidates (A. Voicila, D. Declereq, F. Verdier, M. Fossorier, P. Urard, "Low-complexity, Low-memory EMS algorithm for non-binary LDPC codes" IEEE International Conference on Communications, 2007, ICC '07).

SUMMARY OF THE INVENTION

An algorithm useful for decoding Non Binary LDPC in digital communications, a relative decoder and software code adapted to implement it have been devised.

This algorithm may be repeated for each check node related to a parity check equation of a LDPC code, for generating signals representing a first output table $\overline{S}_{output}$ of corrected values of symbols of a word received through a communication channel and transmitted according to the LDPC code, wherein each row of the table from the first to the last stores, in order, the most probable value down to the least probable value and each column of the table stores the possible values of each symbol. The algorithm may also generate signals representing a second output table $\overline{M}_{output}$ of the logarithm of the ratio between the respective probability of correctness of the values of same coordinates in the first output table $\overline{S}_{output}$ and their corresponding maximum probability of correctness.

According to the method, the values of the output tables are obtained by processing the components of a first input table $\overline{S}_{input}$ of values of a Galois Field of symbols that may have been transmitted and of a second input table $\overline{M}_{input}$ of corresponding probability of correctness of each value. The processing may include filling in the first row of the second output table $\overline{M}_{output}$ by copying the first row of the input table into the first row of the corresponding output table, and filling in the first row of the first output table $\overline{S}_{output}$ by computing the most likely symbol that satisfy the parity check equation. The processing may also include determining the probability values of the second row of the second output table $\overline{M}_{output}$ for each symbol in the hypothesis that one symbol different from the considered one of the received word is assuming its second best value, and determining the corresponding corrected value in the first output table $\overline{S}_{output}$ applying accordingly the check equation. The processing may further include determining the probability values of the third row of the second output table $\overline{M}_{output}$ a for each symbol in the hypothesis that one symbol different from the considered one of the received word is assuming a value different from its most probable value and the value considered at the previous step, and determining the corresponding corrected value in the first output table $\overline{S}_{output}$ applying accordingly the check equation. The processing may yet further include determining the probability values of the fourth and successive rows of the second output table $\overline{M}_{output}$ for each symbol. The determining may include for each symbol, calculating a first probability value in the case that one symbol different from the considered one of the received word is assuming a value different from its most probable value and the values considered at the previous steps, and calculating a second probability value in the case that two symbols different from the considered one of the received word are not assuming their most probable values. The determining may also include checking which is the greatest of the two probability values first and second, and determining the corresponding corrected value in the first output table $\overline{S}_{output}$ applying accordingly the check equation, and outputting the signals representing the so generated output tables first $\overline{S}_{output}$ and second $\overline{M}_{output}$.

The above algorithm may be implemented via software, stored in a computer readable medium, or in a hardware LIST decoder, and executed by a computer or processor. LIST decoders internally generate the input tables $\overline{S}_{input}$, $\overline{M}_{input}$ and, according to an aspect of this invention, they may be further equipped with circuit means adapted to process the input tables according to the algorithm for generating signals representing the output tables.

DETAILED DESCRIPTION OF THE PREFERRED EMBODIMENTS

Figure 1:
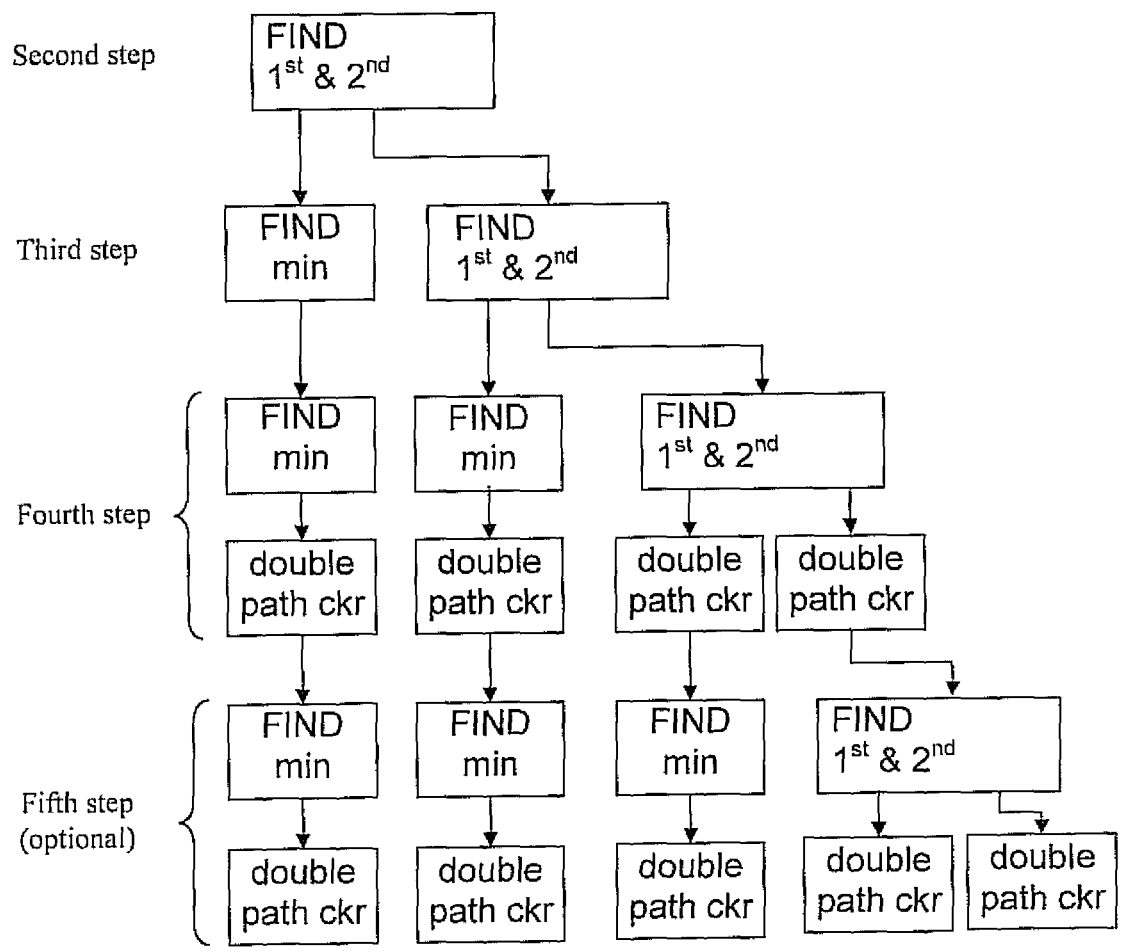
FIG. 1 is a basic high-level block diagram of an embodiment of the algorithm according to the present invention.
Figure 2:
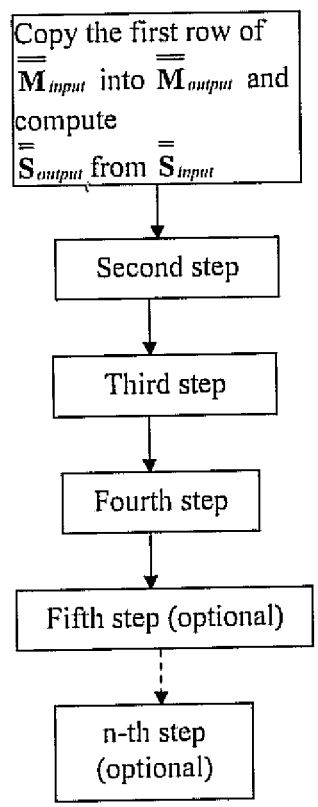
FIGS. 2 to 6 are more detailed block diagrams of the preferred embodiment of the algorithm according to the present invention.
Figure 3:
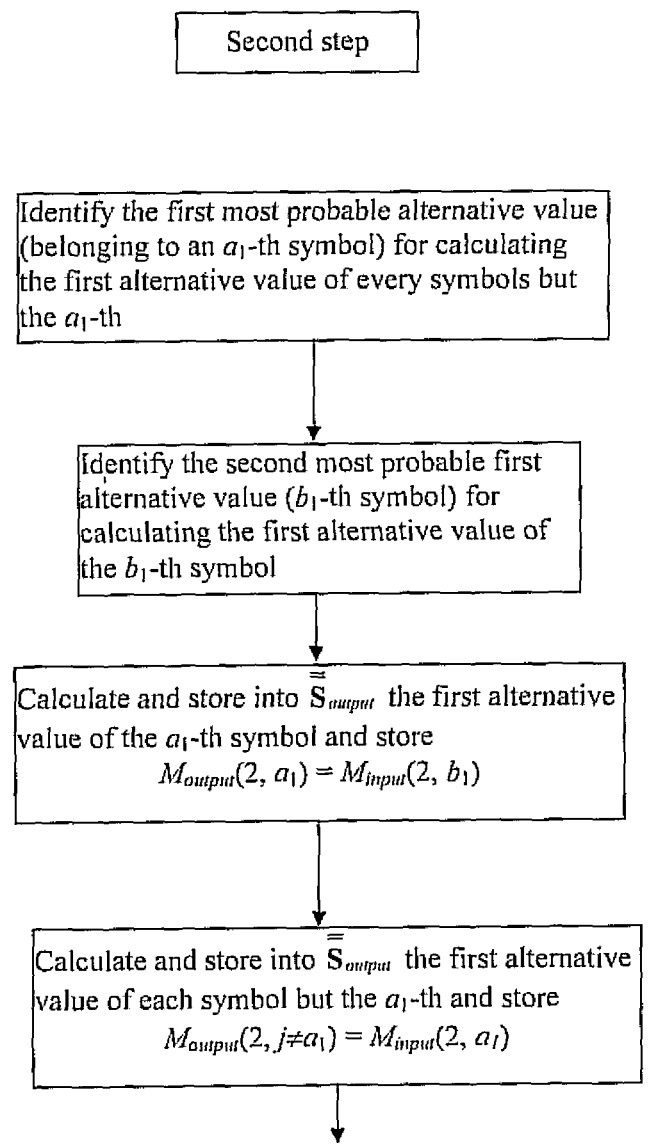
Figure 4:
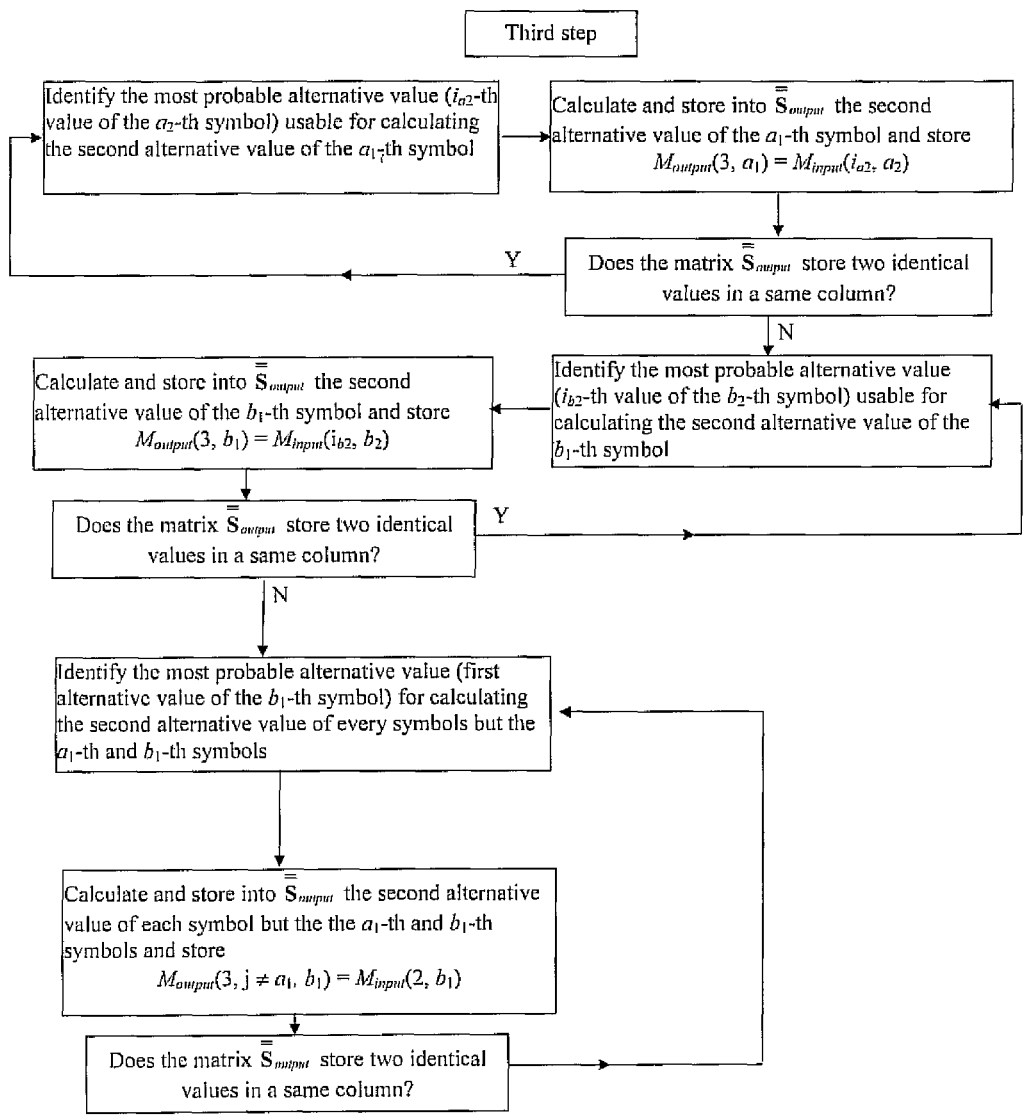
Figure 5A:
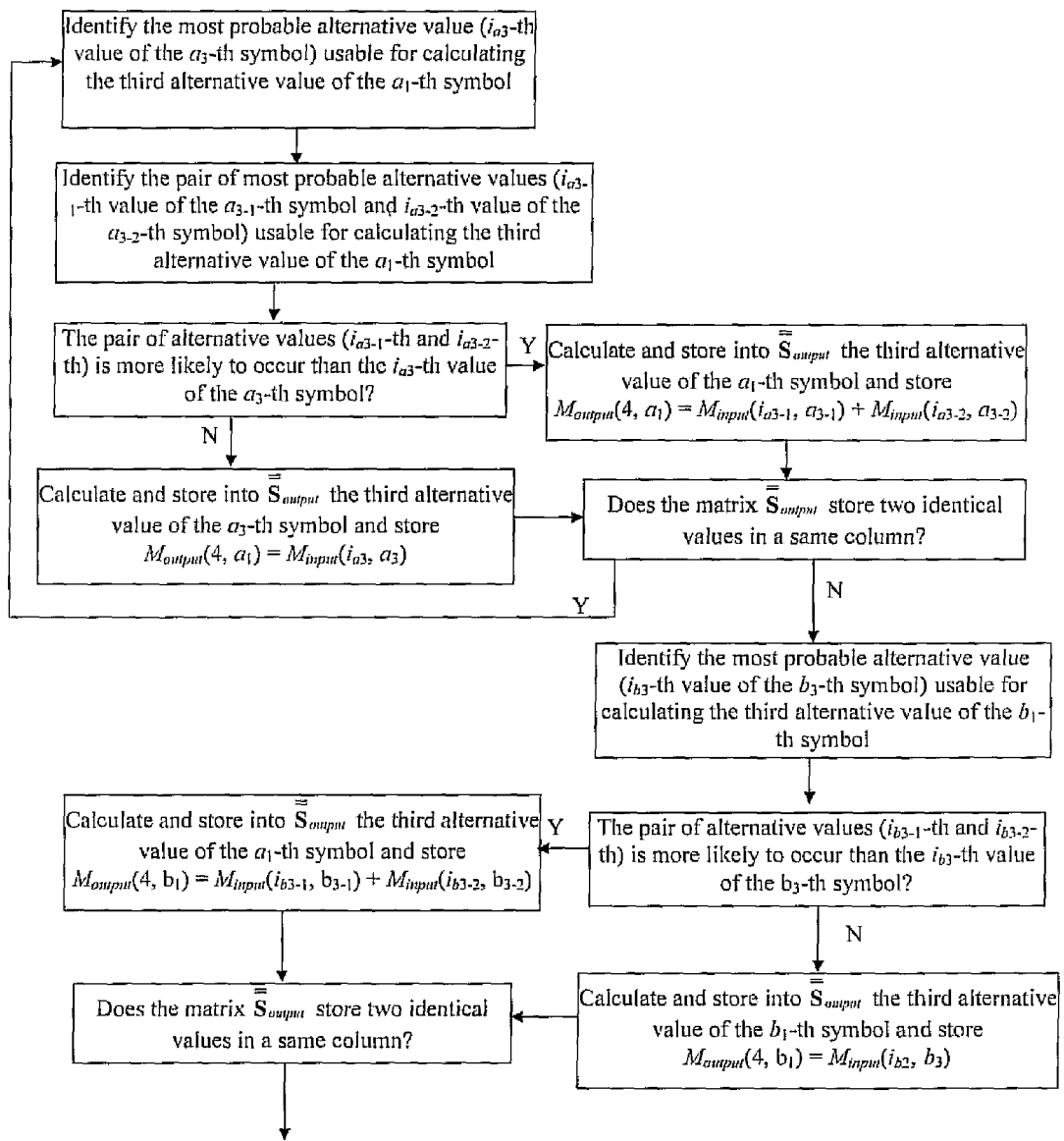
Figure 5B:
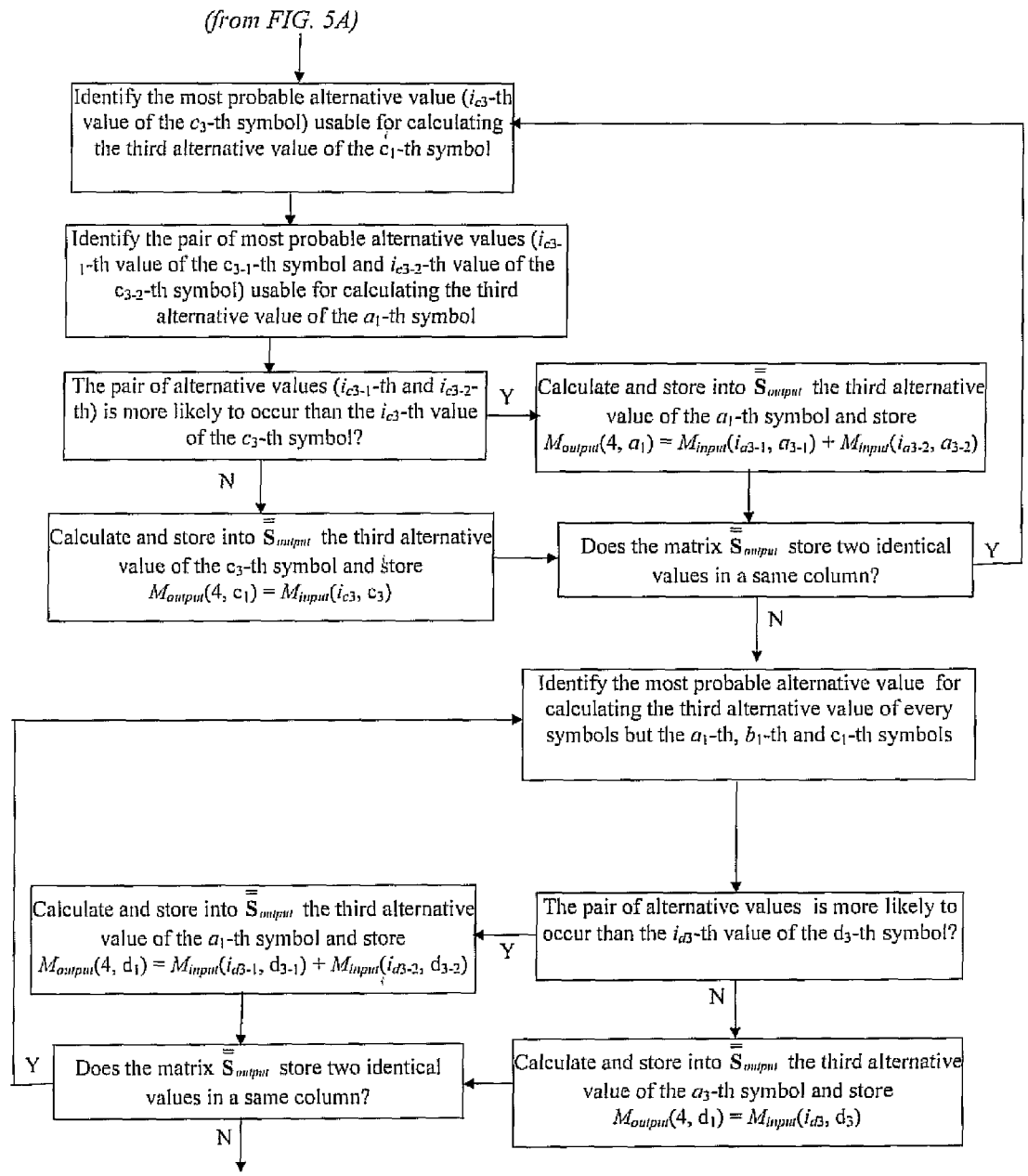
Figure 6:
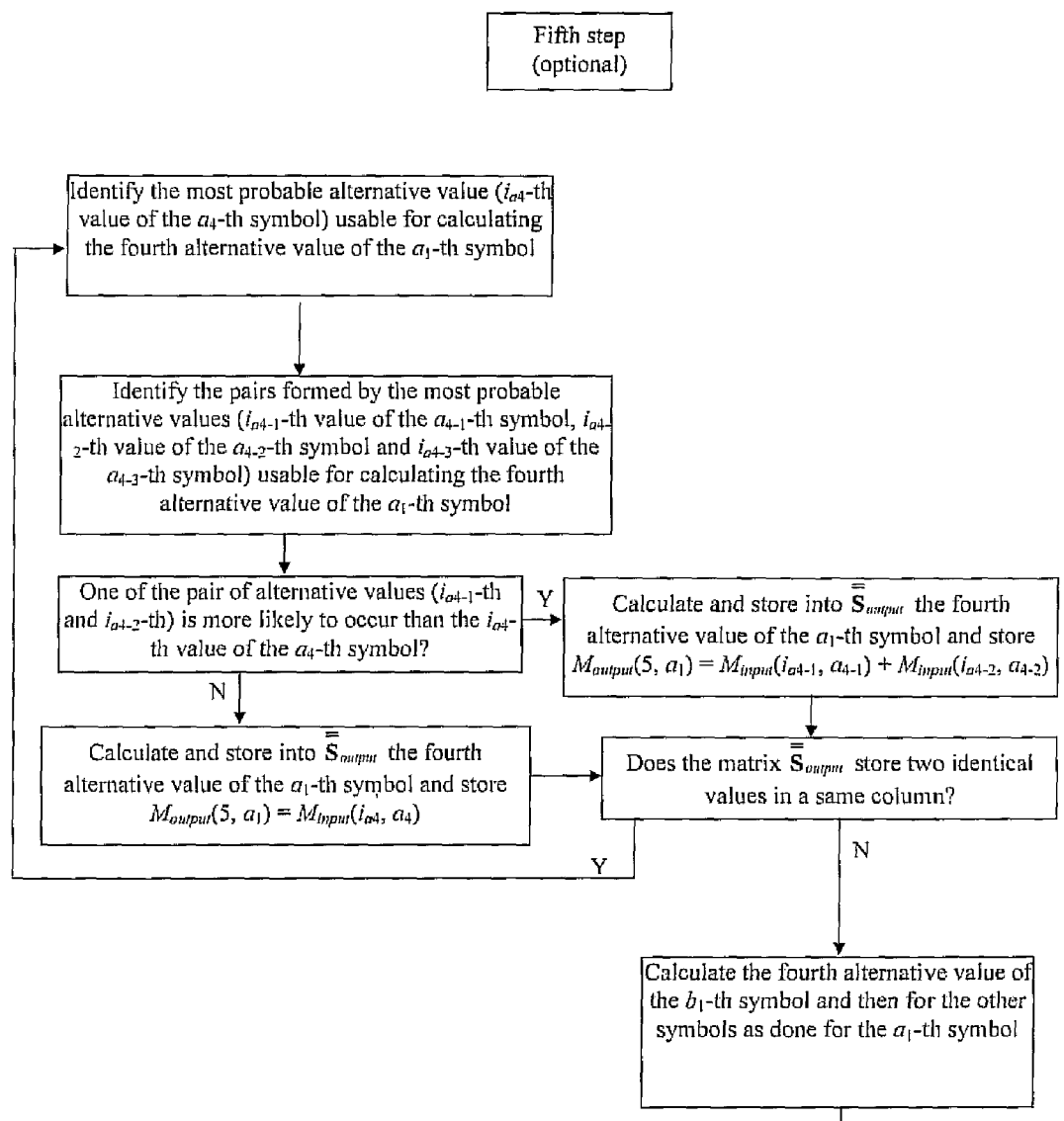

The present invention relies upon the following approach that results in minimal performance losses. The approach includes first sorting the symbol candidates according to the corresponding value in the PMF so that the first candidate results to be the most likely choices, and then preserving in input the PMF of the first n symbol candidates with the exact probabilities and set the $2^{p-n}$ candidate probabilities equal the value of the n-th candidate. The approach then includes computing as output of the SPC the first n symbol candidates with the exact probabilities and set the $2^{p-n}$ equal the value of the n-th candidate.

In order to explain how the SPC works in the present invention, it is beneficial to introduce a new description of $Q_{ij}$. Let consider the generic check i and form a matrix $QW_i$ with the PMF associated to the symbols belonging to the check I $QW_i = [Q_{i1} Q_{i2} \ldots Q_{ij} \ldots Q_{id_c}]$ Then sort every column of $QW_i$ and produce two matrices $\overline{M}_{input}$ and $\overline{S}_{input}$ of dimension ($2^p \times dc$). $M_{input}(i, j)$ is the value of the PMF of the j-th symbol. For a given symbol j, the values $M_{input}(i, j)$ are in ascending order so that the value of most likely candidate is in the first row $M_{input}(1, j)$. For further simplifying the algorithm, the values $M_{input}(i, j)$ are normalized by subtracting the values in the first row so that $M_{input}(1, j) = 0$ and $M_{input}(i, j) = M_{input}(i, j) - M_{input}(1, j)$ for $i = 2, \ldots 2^p$. The generic entry of $S_{input}(i, j)$ of the matrix $\overline{S}_{input}$ is the candidate associated to the PMF value $\overline{M}_{input}(i, j)$. As already described in the previous paragraph, $M_{input}(i, j) = \overline{M}_{input}(n, j)$ for $n < i \leq 2^p$.

The objective of the SPC LIST decoder incorporated in the LDPC decoder is to generate for each set of symbol x̄ belonging to the same parity check j two output tables (matrices) $\overline{M}_{output}$ and $\overline{S}_{output}$, analogous to the tables $\overline{M}_{input}$ and $\overline{S}_{input}$, that describe the SPC output $R_{ji}$. The present invention is mainly related to the introduction of a low complexity SPC LIST decoder.

This invention is more specifically related to the way the check-node processing (CNP) step is performed. In the context of the CNP that solves the problem of delivering new symbols estimate given the constraint of a single parity check it has been found that, considered the set of symbols belonging to a specific SPC of the non binary LDPC, starting from a list of the possible symbols values over a Galois Field $\overline{S}_{input}$ that can be assumed by each of the aforementioned symbols and the associate probability $\overline{M}_{input}$, it is possible to generate, with relatively not onerous calculations, a first output table $\overline{S}_{output}$ containing a list of potentially correct values according to the SPC constraints and a second output table $\overline{M}_{output}$ containing the logarithm of the associated probability of being correct by executing the following operations. The operations include filling the first row of the output table $\overline{M}_{output}$ by copying the first row of the corresponding input tables; the first row of $\overline{S}_{output}$ is filled computing the most likely symbol that satisfy the parity check. The operations also include determining the probability values of the second row of the second output table $\overline{M}_{output}$ a for each symbol in the hypothesis that one symbol different from the considered one of the received word is assuming its second best value, and determining the corresponding corrected value in the first output table $\overline{S}_{output}$ applying accordingly said check equation.

The operations further include determining the probability values of the third row of the second output table $\overline{M}_{output}$ for each symbol in the hypothesis that one symbol different from the considered one of the received word is assuming a value different from its most probable value and the value considered at the previous step, and determining the corresponding corrected value in the first output table $\overline{S}_{output}$ applying accordingly the check equation.

The probability values of the fourth and successive rows of the second output table $\overline{M}_{output}$ may be determined for each symbol. The probability values may be determined by for each symbol, calculating the probability that one symbol different from the considered one of the received word is assuming a value different from its most probable value and the values considered at the previous steps, and calculating the probability that two symbols different from the considered one of the received word are not assuming their most probable values. The probability values are also determined by checking which is the greatest of said two probabilities, and determining the corresponding corrected value in the first output table $\overline{S}_{output}$ applying accordingly said check equation.

In order to better understand how the method works, reference is made to a practical exemplary case of a code in $GF(2^3)$ with a single check equation (thus with a single check-node), though the method may be applied mutatis mutandis to codes belonging to a Galois field of any order and for any number of check equations.

Moreover, the method will be illustrated referring to a particular case in which all symbols of words to be received are involved in the single check node. This is not a limitation and the method remains applicable also if some of the symbols of a received word are involved in a check equation. In this case, what will be stated shall refer to the symbols involved in the considered check equation, the other symbols being ignored as if they were not present.

Let us suppose to use a LDPC defined by a generic check matrix $\overline{H}$, and that the receiver, after having received the incoming word x̄ composed of seven symbols (dc=7), generates the following two matrices $\overline{M}_{input}$ and $\overline{S}_{input}$ that are provided to the decoder:

| 0 | 0 | 0 | 0 | 0 | 0 | 0 |
|---|---|---|---|---|---|---|
| 10 | 2 | 17 | 11 | 4 | 15 | 12 |
|  |  | 7 |  | 6 |  |  |
|  |  |  |  |  |  |  |
|  |  |  |  |  |  |  |
|  |  |  |  |  |  |  |
|  |  |  |  |  |  |  |

| 0 | 2 | 4 | 1 | 7 | 2 | 5 |
|---|---|---|---|---|---|---|
| 5 | 3 | 2 | 0 | 4 | 6 | 1 |
|  |  |  |  |  |  |  |
|  |  |  |  |  |  |  |
|  |  |  |  |  |  |  |
|  |  |  |  |  |  |  |
|  |  |  |  |  |  |  |

The matrix $\overline{S}_{input}$ contains in the first row the values of maximum probability of correctness of each symbol; in the second row the values of second best probability of correctness; in the third row the values of third best probability of correctness and so on.

The generic value $M_{input}(i, j)$ of the matrix $\overline{M}_{input}$ is the opposite of the natural logarithm of the ratio between the probability that the j-th symbol of the received word be equal to the value $S_{input}(i, j)$ of the Galois filed $GF(2^3)$ and the probability that the j-th symbol of the received word be equal to the value $S_{input}(1, j)$.

According to LDPC decoding, the value $S_{input}(1, j)$ is considered and in each (generic k-th) check node the following check value is calculated in the Galois field:

$$\sum_j H(k, j) \cdot S_{input}(1, j) = z(k) \neq 0$$

According to the method, for each check node k, a corrected value $S_{output}(1, j)$ of maximum probability of correctness for each symbol is calculated according to the following equation:

$$S_{output}(1, j) = \frac{z(k) - H(k, j) \cdot S_{input}(1, j)}{H(k, j)}$$

$$M_{output}(1, j) = 0$$

All operations are executed in the Galois field $GF(2^3)$ (in the general case, in the Galois field $2^N$). The above equation for calculating $S_{output}(1, j)$ is to be applied to the symbols that are involved in check calculations performed at the k-th check node (in this case the values $H(k, j)$ at the denominator differ from 0).

The values of maximum probability of correctness in the first row of $\overline{S}_{output}$ and the corresponding logarithm of normalized probability in the first row of $\overline{M}_{output}$ are obtained:

| 0 | 0 | 0 | 0 | 0 | 0 | 0 |
|---|---|---|---|---|---|---|

$M_{output}(1, j)$

In order to fill in the second row of the matrix $\overline{S}_{output}$, according to the method it is necessary to identify the symbols $a_1$-th and $b_1$-th for which:

$$M_{input}(2, a_1) \leq M_{input}(2, j) \forall j \in \{1, \ldots, dc\}$$

$$M_{input}(2, b_1) \leq M_{input}(2, j) \forall j \in \{1, \ldots, dc\} - \{a_1\}$$

In practice, excluding a priori the values of maximum probability of correctness, the above operations correspond to identifying the first most probable value $S_{input}(2, a_1)$ and its corresponding symbol $a_1$, and identifying the second immediately most probable value $S_{input}(2, b_1)$ not belonging to the symbol $a_1$.

In the considered numerical example, the $a_1$-th symbol is the second symbol and the $b_1$-th symbol is the fifth symbol. Two cases are possible: a) the j-th symbol to be corrected is the $a_1$-th symbol (in the exemplary case: j=2); and b) the j-th symbol to be corrected is not the $a_1$-th symbol (in the exemplary case: j≠2).

In case a), the value $S_{output}(2, a_1)$ and its corresponding logarithm of normalized probability $M_{output}(2, a_1)$ are determined according to the following general formulae:

$$S_{output}(2, a_1) = \frac{z(k) - H(k, a_1) \cdot S_{input}(1, a_1) - H(k, b_1) \cdot S_{input}(1, b_1) + H(k, b_1) \cdot S_{input}(2, b_1)}{H(k, a_1)} =$$
$$= S_{output}(1, a_1) + \frac{H(k, b_1)}{H(k, a_1)} \cdot (S_{input}(2, b_1) - S_{input}(1, b_1));$$

$$M_{output}(2, a_1) = M_{input}(2, b_1).$$

It is worth nothing here that the difference $(S_{input}(2, b_1) - S_{input}(1, b_1))$ is part of the value that will be used to store in a compressed way the whole $\overline{S}_{output}$ table.

In case b), the value $S_{output}(2, j)$ and its corresponding probability $M_{output}(2, j) \forall j \neq a_1$ are determined according to the following general formulae:

$$S_{output}(2, j) = \frac{z(k) - H(k, j) \cdot S_{input}(1, j) - H(k, a_1) \cdot S_{input}(1, a_1) + H(k, a_1) \cdot S_{input}(2, a_1)}{H(k, j)}$$
$$= S_{output}(1, j) + \frac{H(k, a_1)}{H(k, j)} \cdot (S_{input}(2, a_1) - S_{input}(1, a_1));$$

$$M_{output}(2, j) = M_{input}(2, a_1).$$

It is worth nothing here that the difference $(S_{input}(2, a_1) - S_{input}(1, a_1))$ is part of the value that will be used to store in a compressed way the whole $\overline{S}_{output}$ table.

Considering the numerical example, the first two rows of the output probability matrix are

| 0 | 0 | 0 | 0 | 0 | 0 | 0 |
|---|---|---|---|---|---|---|
| 2 | 4 | 2 | 2 | 2 | 2 | 2 |

$M_{output}(1, j), M_{output}(2, j)$

Independently from the degree of the check matrix, the second row of the output probability matrix $\overline{M}_{output}$ has been filled with two values different from zero. This is particularly advantageous because it greatly simplifies the recording of the matrix in a memory.

The $a_1$-th column of the output probability matrix $\overline{M}_{output}$ is the sole column different from the other columns.

It is easy to verify that the output matrix $\overline{S}_{output}$ that is being filled so far cannot contain twice a same value in a same column.

The values of the row $S_{output}(3, j)$ are calculated in order starting from the value $S_{output}(3, a_1)$; then the value $S_{output}(3, b_1)$ and the other values are calculated according to a procedure similar to that used for calculating the second row. Differently from the previous step, now attention should be paid to avoid filling in a same column of the matrix $\overline{S}_{output}$ repeating twice a same value.

The value $S_{output}(3, a_1)$ is calculated by:

a) looking at the matrix of input probabilities $\overline{M}_{input}$ to identify the $a_2$-th symbol for which $$M_{input}(i_{a2}, a_2) \leq M_{input}(i,j) \forall i \geq 2, a_2 \neq a_1 \text{ and } (i_{a2}, a_2) \neq (2, b_1);$$

b) calculating the value $S_{output}(3, a_1)$ and the corresponding logarithm of normalized probability $M_{output}(3, a_1)$ using the following formulae:

$$S_{output}(3, a_1) = \frac{z(k) - H(k, a_1) \cdot S_{input}(1, a_1) - H(k, a_2) \cdot S_{input}(1, a_2) + H(k, a_2) \cdot S_{input}(i_{a2}, a_2)}{H(k, a_1)} =$$
$$= S_{ouput}(1, a_1) + \frac{H(k, a_2)}{H(k, a_1)} \cdot \begin{pmatrix} S_{input}(i_{a2}, a_2) - \\ S_{input}(1, a_2) \end{pmatrix}$$

$$M_{output}(3, a_1) = M_{input}(i_{a2}, a_2);$$

It is worth nothing here that the difference $(S_{input}(i_{a2}, a_2) - S_{input}(1, a_2))$ is part of the value that will be used to store in a compressed way the whole $\overline{S}_{output}$ table;

c) checking whether or not $S_{output}(3, a_1) = S_{output}(2, a_1)$ and, in the affirmative case, restarting the procedure from point a) choosing a different pair $(i_{a2}, a_2)$.

In the exemplary numerical case the pair $(i_{a2}, a_2)$ is (3, 5).

The output probability matrix is being filled as follows

| 0 | 0 | 0 | 0 | 0 | 0 | 0 |
|---|---|---|---|---|---|---|
| 2 | 4 | 2 | 2 | 2 | 2 | 2 |
|   | 6 |   |   |   |   |   |

The value $S_{output}(3, b_1)$ and the other values $S_{output}(3, j) \forall j \neq a_1, b_1$ are calculated with a procedure similar to that for calculating $S_{output}(2, a_1)$ and the other values $S_{output}(2, j) \forall j \neq a_1$.

According to the method, the symbol $b_2$-th and $c_2$-th for which:

$$M_{input}(i_{b2}, b_2) \leq M_{input}(i,j) \forall j \in \{1, \ldots, dc\} - \{b_1\}, b_2 \neq b_1 \text{ and } (i_{b2}, b_2) \neq (2, a_1);$$

$$M_{input}(i_{c2}, c_2) \leq M_{input}(i,j) \forall j \in \{1, \ldots, dc\} \text{ and } (i_{c2}, c_2) \neq (2, a_1),$$

are identified.

In practice, excluding a priori the values of maximum probability of correctness and the value $S_{input}(2, a_1)$ already considered in the previous step, the above operation corresponds to identifying the first most probable value $S_{input}(i_{c2}, c_2)$ and its corresponding symbol $c_2$, and identifying the second most probable value $S_{input}(i_{b2}, b_2)$ and its corresponding symbol $b_2$ different from the symbol $b_1$.

It may occur that the value $S_{input}(i_{c2}, c_2)$ is the value $S_{input}(2, b_1)$. In the considered numerical example, the $c_2$-th symbol is again the fifth symbol and the $b_2$-th symbol is again the second symbol.

Two cases are possible: a) the j-th symbol to be corrected is the $b_1$-th symbol (in the exemplary case: j=5); and b) the j-th symbol to be corrected is neither the $b_1$-th or $a_1$-th or $c_2$-th symbol (in the exemplary case: j≠5, 2). As stated before, the $c_2$-th symbol is the $b_2$-th symbol.

In case a), the value $S_{output}(3, b_1)$ and its corresponding logarithm of normalized probability $M_{output}(3, b_1)$ are determined according to the following general formulae:

$$S_{output}(3, b_1) = \frac{z(k) - H(k, b_1) \cdot S_{input}(1, b_1) - H(k, b_2) \cdot S_{input}(1, b_2) + H(k, b_2) \cdot S_{input}(i_{b2}, b_2)}{H(k, b_1)} =$$
$$= S_{ouput}(1, b_1) + \frac{H(k, b_2)}{H(k, b_1)} \cdot (S_{input}(i_{b2}, b_2) - S_{input}(1, b_2))$$

$$M_{output}(3, b_1) = M_{input}(i_{b2}, b_2)$$

It is worth nothing here that the difference $(S_{input}(i_{b2}, b_2) - S_{input}(1, b_2))$ is part of the value that will be used to store in a compressed way the whole $\overline{S}_{output}$ table.

Also in this case, it is to be checked whether or not $S_{output}(3, b_1) \neq S_{output}(2, b_1)$ and eventually to identify the immediately less probable value than $S_{input}(i_{b2}, b_2)$ to be used in place thereof.

By looking at the input probability matrix of the numerical example, $S_{input}(i_{b2}, b_2) = S_{input}(3, 2)$ because $M_{input}(3, 2) = 7$. Therefore, the output probability matrix is

| 0 | 0 | 0 | 0 | 0 | 0 | 0 |
|---|---|---|---|---|---|---|
| 2 | 4 | 2 | 2 | 2 | 2 | 2 |
|   | 6 |   |   | 7 |   |   |

In case b), the value $S_{output}(3, j)$ and its corresponding probability $M_{output}(3, j) \forall j \neq a_1, b_1$ are determined according to the following general formulae:

$$S_{output}(3, j) = \frac{z(k) - H(k, j) \cdot S_{input}(1, j) - H(k, c_2) \cdot S_{input}(1, c_2) + H(k, c_2) \cdot S_{input}(i_{c2}, c_2)}{H(k, j)} =$$
$$= S_{ouput}(1, j) + \frac{H(k, c_2)}{H(k, j)} \cdot (S_{input}(i_{c2}, c_2) - S_{input}(1, c_2));$$

$$M_{output}(3, j) = M_{input}(i_{c2}, c_2).$$

It is worth nothing here that the difference $(S_{input}(i_{c2}, c_2) - S_{input}(1, c_2))$ is part of the value that will be used to store in a compressed way the whole $\overline{S}_{output}$ table.

Also in this case, it is to be checked whether or not $S_{output}(3, j) \neq S_{output}(2, j)$ and eventually to identify the immediately less probable value than $S_{input}(i_{c2}, c_2)$ to be used in place thereof.

In the exemplary numerical case, the output probability matrix is filled as follows

| 0 | 0 | 0 | 0 | 0 | 0 | 0 |
|---|---|---|---|---|---|---|
| 2 | 4 | 2 | 2 | 2 | 2 | 2 |
| 4 | 6 | 4 | 4 | 7 | 4 | 4 |

$M_{output}(1, j)$ $M_{output}(2, j)$ $M_{output}(3, j)$

At the end of this step there are at most two columns (the $a_1$-th and the $b_1$-th) in the output probability matrix different from the other columns.

For sake of example, let us suppose that the condition $$H(k,c_2) \cdot (S_{input}(i_{c2},c_2) - S_{input}(1,c_2)) \neq H(k,a_1) \cdot (S_{input}(2, a_1) - S_{input}(1,a_1))$$

is not satisfied. A different value $S_{input}(i_{c2}, c_2)$ is identified, which in the numerical example is used in place of $S_{input}(3, 5)$, thus obtaining the following alternative output probability matrix

| 0 | 0 | 0 | 0 | 0 | 0 | 0 |
|---|---|---|---|---|---|---|
| 2 | 4 | 2 | 2 | 2 | 2 | 2 |
| 6 | 6 | 6 | 6 | 7 | 6 | 6 |

$M_{output}(1, j)$ $M_{output}(2, j)$ $M_{output}(3, j)$

The values of the fourth row of the output matrix of values $\overline{S}_{output}$ are calculated starting from the $a_1$-th symbol, then calculating in order the values of the symbols $S_{output}(4, b_1)$, $S_{output}(4, b_2)$ (if not yet calculated) and of the other symbols with a procedure similar to that used for filling in the third row and using practically the same formulae. At each calculation, it is to be checked whether or not there are two identical symbols for a same column of the output matrix $\overline{S}_{output}$, and in this case a different value should be chosen as done in the calculations for the third most probable values.

A difference in respect to the algorithm used for filling the third row exists in that, in the algorithm for filling from the fourth row onwards, it may not be possible to exclude a priori that the logarithm of normalized probability of a value identified in this step be larger than the sum of two nonnull values stored in the input probability matrix. This case will be considered later and corresponds to the event in which a received symbol is assuming its value of fourth best probability of correctness and two other symbols are not assuming their values of maximum probability of correctness.

Let us now suppose that this is not the case, as in the considered numerical example. The value $S_{output}(4, a_1)$ is calculated by looking at the matrix of input probabilities $\overline{M}_{input}$ to identify the $a_3$-th symbol for which $M_{input}(i_{a3}, a_3) \leq M_{input}(i, j) \forall j \in \{1, \ldots, dc\} - \{a_1\}$, $i \geq 2$, $a_3 \neq a_1$ and $(i_{a3}, a_3) \neq (i_{a2}, a_2)$, $(2, b_1)$. This step corresponds to identifying the most probable value not belonging to the symbol $a_1$ and not corresponding to the values $(i_{a2}, a_2)$, $(2, b_1)$ already considered for the symbol $a_1$. The value $S_{output}(4, a_1)$ is further calculated by calculating the value $S_{output}(4, a_1)$ and the corresponding logarithm of normalized probability $M_{output}(4, a_1)$ using the following formulae:

$$S_{output}(4, a_1) = \frac{z(k) - H(k, a_1) \cdot S_{input}(1, a_1) - H(k, a_3) \cdot S_{input}(1, a_3) + H(k, a_3) \cdot S_{input}(i_{a3}, a_3)}{H(k, a_1)} =$$
$$= S_{ouput}(1, a_1) + \frac{H(k, a_3)}{H(k, a_1)} \cdot (S_{input}(i_{a3}, a_3) - S_{input}(1, a_3))$$

$M_{output}(4, a_1) = M_{input}(i_{a3}, a_3);$

It is worth nothing here that the difference $(S_{input}(i_{a3}, a_3) - S_{input}(1, a_3))$ is part of the value that will be used to store in a compressed way the whole $\overline{S}_{output}$ table.

The value $S_{output}(4, a_1)$ is further calculated by checking whether or not $S_{output}(4, a_1) = S_{output}(2, a_1)$ or $S_{output}(4, a_1) = S_{output}(3, a_1)$ and, in the affirmative case, restarting the procedure from point a) choosing a different pair $(i_{a3}, a_3)$.

In the exemplary numerical case, the pair $(i_{a3}, a_3)$ is $(2, 1)$. Therefore, the output probability matrix is being filled as follows:

| 0  | 0 | 0 | 0 | 0 | 0 | 0 |
|----|---|---|---|---|---|---|
| 2  | 4 | 2 | 2 | 2 | 2 | 2 |
| 4  | 6 | 4 | 4 | 7 | 4 | 4 |
| 10 |   |   |   |   |   |   |

The value $S_{output}(4, b_1)$ is calculated by:

a) looking at the matrix of input probabilities $\overline{M}_{input}$ to identify the $b_3$-th symbol for which $M_{input}(i_{b3}, b_3) \leq M_{input}(i, j) \forall j \in \{1, \ldots, dc\} - \{b_1\}$, $i \geq 2$, $b_3 \neq b_1$ and $(i_{b3}, b_3) \neq (i_{b2}, b_2)$, $(2, a_1)$. This step corresponds to identifying the most probable value not belonging to the symbol $b_1$ and not corresponding to the values $(i_{b2}, b_2)$, $(2, a_1)$ already considered for the symbol $b_1$;

b) calculating the value $S_{output}(4, b_1)$ and the corresponding logarithm of normalized probability $M_{output}(4, b_1)$ using the following formulae:

$$S_{output}(4, b_1) = \frac{z(k) - H(k, b_1) \cdot S_{input}(1, b_1) - H(k, b_3) \cdot S_{input}(1, b_3) + H(k, b_3) \cdot S_{input}(i_{b3}, b_3)}{H(k, b_1)} =$$
$$= S_{ouput}(1, b_1) + \frac{H(k, b_3)}{H(k, b_1)} \cdot (S_{input}(i_{b3}, b_3) - S_{input}(1, b_3))$$

$M_{output}(4, b_1) = M_{input}(i_{b3}, b_3).$

It is worth nothing here that the difference $(S_{input}(i_{b3}, b_3) - S_{input}(1, b_3))$ is part of the value that will be used to store in a compressed way the whole $\overline{S}_{output}$ table.

c) checking whether or not $S_{output}(4, b_1) = S_{output}(2, b_1)$ or $S_{output}(4, b_1) = S_{output}(3, b_1)$ and, in the affirmative case, restarting the procedure from point a) choosing a different pair $(i_{b3}, b_3)$.

In the exemplary numerical case, the pair $(i_{b3}, b_3)$ is $(2, 1)$. The output probability matrix is being filled as follows:

| 0 | 0 | 0 | 0 | 0 | 0 | 0 |
|---|---|---|---|---|---|---|
| 2 | 4 | 2 | 2 | 2 | 2 | 2 |
| 4 | 6 | 4 | 4 | 7 | 4 | 4 |
|   | 10|   |   | 10|   |   |

Then the remaining values $S_{output}(4, j)$ for the other symbols are calculated neglecting the values of maximum probability of correctness and the already considered values $S_{input}(2, a_1)$ and $S_{input}(I_{c2}, c_2)$ through the following steps:

a) identifying usable the first most probable value $S_{input}(i_{d3}, d_3)$ and its corresponding symbol $d_1$, and b) identifying the usable second immediately most probable value $S_{input}(i_{c3}, c_3)$.

The output probability matrix becomes

| 0 | 0 | 0 | 0 | 0 | 0 | 0 |
|---|---|---|---|---|---|---|
| 2 | 4 | 2 | 2 | 2 | 2 | 2 |
| 4 | 6 | 4 | 4 | 7 | 4 | 4 |
| 6 | 10| 6 | 6 | 10| 6 | 6 |

$M_{output}(1, j)$ $M_{output}(2, j)$ $M_{output}(3, j)$, $M_{output}(4, j)$

At the end of this step there will be at most three columns ($a_1$-th, $b_1$-th and $c_3$-th) different from the other columns in the output probability matrix $\overline{M}_{output}$.

As stated before, it should be checked whether the logarithm of normalized probability of a value identified in this step for any symbol is larger than the sum of two nonnull values stored in the input probability matrix usable for that symbol, i.e.:

$$M_{input}(i,j) > M_{input}(i_1, j_1) + M_{input}(i_2, j_2).$$

This check has been schematically indicated in FIG. 1 with the label DOUBLE PATH CKR. Let us suppose that this check is positive for the symbol $a_1$:

$$M_{input}(i_{a3}, a_3) > M_{input}(i_{a3-1}, a_{3-1}) + M_{input}(i_{a3-2}, a_{3-2});$$

In this case, the matrices $\overline{M}_{output}$ and $\overline{S}_{output}$ are filled in as follows:

$$M_{output}(4, a_1) = M_{input}(i_{a3-1}, a_{3-1}) + M_{input}(i_{a3-2}, a_{3-2});$$

$$S_{output}(4, a_1) =$$

$$S_{output}(1, a_1) + \frac{H(k, a_{3-1})}{H(k, a_1)} \cdot (S_{input}(i_{a3-1}, a_{3-1}) - S_{input}(1, a_{3-1})) ++$$

$$\frac{H(k, a_{3-2})}{H(k, a_1)} \cdot (S_{input}(i_{a3-2}, a_{3-2}) - S_{input}(1, a_{3-2})).$$

The symbols $a_{3-1}$ and $a_{3-2}$ may be different, otherwise they stay on the same column of the input matrix and therefore they cannot be taken. It may happen that, for a same symbol s, the second and third value of the output probability values are equal to values of a same symbol l of the input probability matrix, $$M_{output}(2,s) = M_{input}(\ldots, l);$$

$$M_{output}(3,s) = M_{input}(\ldots, l)$$

This one may not be accepted as double error but such possibility cannot be excluded.

In fact two symbols may be looked for:

$S1' = S_{input}(i_d, d) - S_{input}(1, d)$ such that $H(k, d) \cdot (S_{input}(i_d, d) - S_{input}(1, d)) = H(k, n) \cdot (S_{input}(2, n) - S_{input}(1, n))$ $S2' = S_{input}(i_1, t) - S_{input}(1, t)$ such that $H(k, t) \cdot (S_{input}(i_1, t) - S_{input}(1, t)) = H(k, z) \cdot (S_{input}(2, Z) - S_{input}(1, z))$ These two symbols give the same contribution of the original one (in term of symbol of the Galois Field) but are not on the same column.

The magnitude of the two pairs is computed and compared: the smallest between the triplet $\{M_{input}(i_1, 1), (M_{input}(i_d, d) + M_{input}(2, Z)), (M_{input}(i_1, t) + M_{input}(2, n))\}$ is the selected magnitude. Concerning the $S_{output}$, they give exactly the same contribution.

The above check should be carried out for every symbol. The algorithm could be stopped at this step, because in general four alternative values for each symbol are sufficient.

As an alternative, in the unlikely event that four alternative values for each symbols be insufficient, a fifth step may be executed.

The fifth most probable values are calculated starting from the different columns ($a_1$-th, $b_1$-th and $c_3$-th) following the same reasoning used for calculating the symbol $S_{output}(4, a_1)$; then the symbol $S_{output}(5, c_3)$ is calculated (if it has not yet been calculated) as done for the symbol $S_{output}(3, b_1)$; finally the remaining symbols are calculated as done for the other symbols $S_{output}(3, j)$.

At each calculation, it is to be checked whether or not there two identical symbols for a same column of the output matrix $\overline{S}_{output}$ have been calculated, and in that case a different value should be chosen as done in the calculations for the third most probable values. As for the previous step, the check DOUBLE PATH CKR should be carried out. Obviously here we have three possibilities of double path.

At the end of this fifth step, the output probability matrix is as follows:

| 0 | 0 | 0 | 0 | 0 | 0 | 0 |
|---|---|---|---|---|---|---|
| 2 | 4 | 2 | 2 | 2 | 2 | 2 |
| 4 | 6 | 4 | 4 | 7 | 4 | 4 |
| 6 | 10| 6 | 6 | 10| 6 | 6 |
| 7 | 11| 7 | 7 | 11| 7 | 7 |

$M_{output}(1, j)$, $M_{output}(2, j)$, $M_{output}(3, j)$ $M_{output}(4, j)$, $M_{output}(5, j)$ It would be possible to continue calculating the other less probable values by repeating the above procedure, though five values for each symbol are commonly considered enough for every practical application.

The fifth candidate has the same exception of the fourth one. There are three possibilities that we indicate for simplicity using the matrix $\overline{M}_{output}$:

$M_{output}(2, i) + M_{output}(3, i)$
$M_{output}(2, i) + M_{output}(4, i)$
$M_{output}(3, i) + M_{output}(4, i)$ Again, if the symbols that generate one or all this pairs are on the same column in the input matrix, a search to identify S1', S2', S3' is performed and all the possibilities are analyzed. Note that in case a double error is present in fourth candidate, it is not necessary to look for it in the fifth.

The above algorithm is summarized in Figures from 1 to 6, that will appear self-explaining in view of the above discussion and for this reason will not be illustrated further.

The above disclosed method may be implemented in a hardware LIST decoder or with a software computer program executed by a computer.

The method is relatively simple because it does not require calculation of Fourier transforms or logarithms, but additions and multiplications in a Galois field, thus it may be implemented in real time applications.

Another key advantage of the present invention is related to the amount of memory used to store the temporary values $R_{ji}$ that are basically the table $\overline{M}_{output}$ and $\overline{S}_{output}$ for each parity check. Instead of storing the whole tables a great storage reduction comes from the following rules that are part of the present invention and that can be easily generalized by those expert in the field.

In practice, the output tables $\overline{M}_{output}$ and $\overline{S}_{output}$ may be calculated through very simple operations from relatively few values. Therefore, instead of storing the whole output tables $\overline{M}_{output}$ and $\overline{S}_{output}$, that may be very large and use a great amount of memory space, it is possible equivalently to store the few values that are necessary to calculate them. This will result in a great reduction of memory space dedicated for storing the output tables.

The present embodiment is focused on the approach of computing the first five candidates, but the invention is not limited to this case. Given a parity check output $\overline{M}_{output}$ it can be demonstrated that there are 14 different values in the table. To calculate the fifth candidates for every symbols just 14=2+3+4+5 parameters are necessary.

To recover the information to reproduce the whole tables $\overline{M}_{output}$ and $\overline{S}_{output}$ the following values may be stored:
- the four values indicating the indexes of the special columns: $a_1, b_1, c_2, d_3$;
- the values of $S_{input}(1, i) \forall i$
- for column $a_1$, that is the first column that differentiates from the others, symbols $S_{input}(2, b_1) - S_{input}(1, b_1))$ that give $S_{input}(2, a_1)$ and analogous differences for $S_{input}(s, a_1)$ with s=3, 4;
- analogously, for column $b_1$, that is the second column that differentiates from the others, the three differences already highlighted in the previous section;
- analogously for column $c_2$, that is the third column that differentiates from the others, the two differences already highlighted in the previous section;
- for the last optional step, for column $d_3$ that is the fourth column that differentiates from the others, the differences already highlighted in the previous section.

When five different candidates are considered, the storage of $S_{output}(5, i)$ is not required.

Overall memory used to represent $\overline{M}_{output}$ and $\overline{S}_{output}$, supposing check degree equal to dc, includes the 14 different entries of $\overline{M}_{output}$, the (dc+9) GF values and four indexes to identify the special columns. This represents a great improvement in respect to the prior art that would involve storing dc*n GF values and dc*n+1 probabilities.

Decoder Architecture

Figure 7:
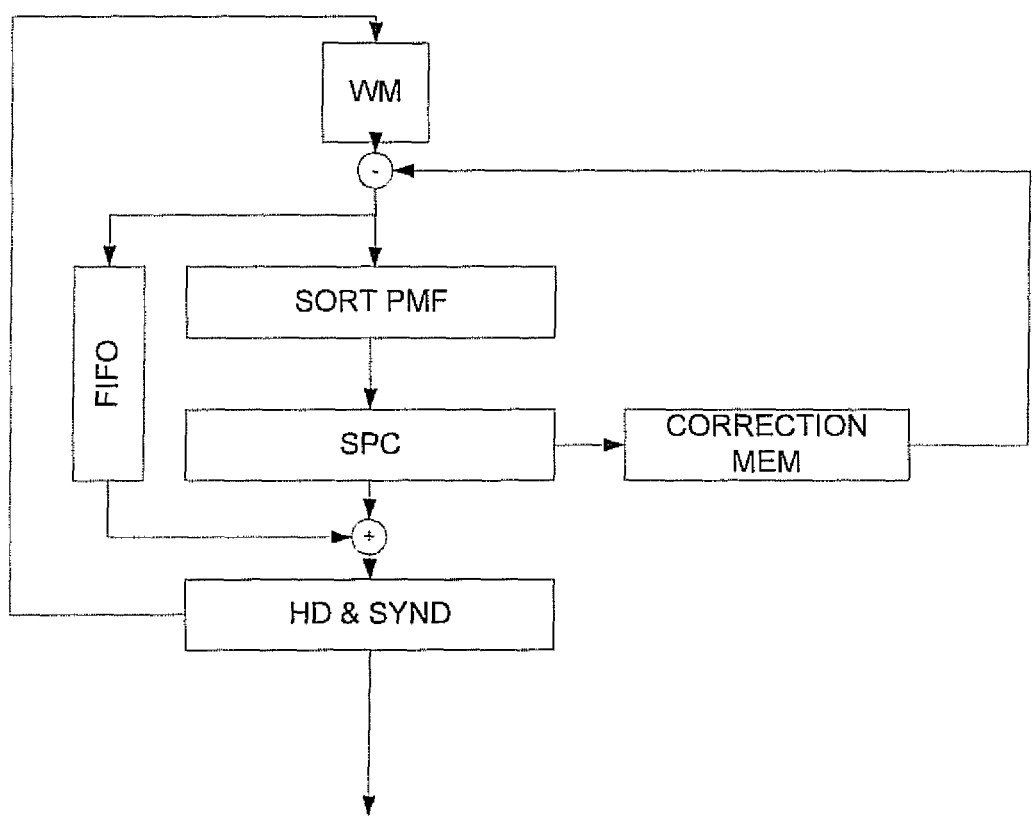
FIG. 7 is a functional block scheme of the architecture of a decoder adapted to implement the algorithm of the present invention.

A macro-architecture suggested for the implementation of the algorithm is depicted in FIG. 7. The meaning and the function executed by each block is summarized in the following table.

| | |
|---|---|
| WM | Memory device storing probability values of the input probability matrix $\overline{M}_{input}$ |
| FIFO | FIFO buffer: it hold $Q_{ij}$ to make them available for being added to $R_{ij}$ and fed Hard decision Block and WM. |
| SORT PMF | Logic circuit block adapted to sort the probability values stored in the input probability matrix $\overline{M}_{input}$ |
| SPC | Circuit block for carrying out the parity check SPC |
| CORRECTION MEM | Memory device that stores $R_{ji}$, the output of SPC. It is used to generate on the fly input to SORT PMF block |
| HD&SYND | Hard Decision and Syndrome computation |

The memory WM contains the PMFs of the symbols At the beginning, they are initialized with the demodulator (or detector) outputs and then they are updated accordingly to the decoding algorithm schedule.

The variable-to-check PMF are first sorted to identify the first n candidates magnitudes (five magnitudes in the preferred implementation over $GF(2^3)$). The remaining magnitudes are assumed to be equal to the fifth.

The sorted PMF are passed to the SPC block that performs the CNP (computation of $R_{ji}$). The CORRECTION MEM contains the check-to-variable messages $R_{ji}$. The memory size can be greatly reduced following the rules given in the last part of the present disclosure.

That which is claimed:

1. A method of generating, for each check node related to a parity check equation of a LDPC code, a first output table of corrected values of symbols of a word received through a communication channel and transmitted according to the LDPC code, wherein each row of the first output table, from first to last, stores, in order, a most probable value down to a least probable value, and each column of the first output table stores possible values of each symbol, the method also for generating a second output table of a logarithm of a ratio between a respective probability of correctness of values of same coordinates in the first output table and their corresponding maximum probability of correctness, by processing components of a first input table of values of a Galois Field of symbols and of a second input table of corresponding probability of correctness of each value, the method comprising:
    filling in a first row of the second output table by copying a first row of the first input table into a first row of the second output table, and filling in the first row of the first output table by computing a most likely symbol that satisfies the parity check equation;
    determining probability values of a second row of the second output table for each symbol if one symbol different from a considered one of the received word is assuming its second best value, and determining a corresponding corrected value in the first output table by applying the parity check equation;
    determining probability values of a third row of the second output table for each symbol if one symbol different from a considered one of the received word is assuming a value different from its most probable value and a value previously considered in determining the probability values for the second output table, and determining a corresponding corrected value in the first output table by applying the parity check equation; and
    determining probability values of fourth and successive rows of the second output table for each symbol, by at least
        for each symbol, calculating a first probability value in a case that one symbol different from a considered one of the received word is assuming a value different from its most probable value and a value previously considered, and calculating a second probability value in a case that two symbols different from the considered one of the received word are not assuming their most probable values, and checking which of the first and second probability values is greater, and determining a corresponding corrected value in the first output table by applying the parity check equation;

outputting the first and second output tables.

2. The method of claim 1, further comprising filling in the second row of the first and second output tables by:

a1) identifying in the first and second input tables a symbol having a greatest second best probability of correctness;

a2) identifying in the first and second input tables a symbol different from the symbol having the second greatest second best probability of correctness;

a3) generating a corrected value of the second best probability of correctness of the symbol using the parity check equation if a value assumed by the symbol is the second best probability of correctness;

a4) generating corrected values of a second best probability of correctness of all symbols but the symbol using the parity check equation if a value assumed by the symbol is the second best probability of correctness;

a5) filling in the second row of the first output table with the corrected values of the second best probability of correctness of all symbols but the symbol using the parity check equation; and a6) filling in the second row of the second output table according to $M_{output}(2, a_1)=M_{input}(2, b_1)$, and $M_{output}(2, j)=M_{input}(2, a_1)$ $\forall j \neq a_1$, where a1 is the symbol having the greatest second best probability of correctness, and where b1 is the symbol having the second greatest second best probability of correctness.

3. The method of claim 2, further comprising filling in third and successive rows of the first and second output tables by:

b1) for symbols that have been identified in a previously executed step, repeating a1), a3), a5) and a6), preventively discarding values of the first input table already taken into consideration for the same symbol, b2) for the remaining symbols, repeating the operations a2), a4), a5) and a6) as for the symbol different from the symbol having the second greatest second best probability of correctness, discarding values of the first input table already taken into consideration for that same symbol;

b3) for each symbol, checking whether a calculated corrected value has been obtained for the same symbol in a previous step and, if not, repeating at least one of b1) and b2).

4. The method of claim 3, further comprising, before calculating values of a fourth best down to a least probability of correctness of the symbols:

c1) determining a probability of correctness of a corrected value of the fourth best down to the least best probability of correctness of the considered symbol calculated using the parity check equation if one symbol is not assuming its value of best probability of correctness;

c2) determining the probability of correctness of the corrected value of fourth best down to the least best probability of correctness of the considered symbol calculated using the parity check equation if two symbols are not assuming their values of best probability of correctness; and c3) if the probability of correctness determined at C2) is greater than probability of correctness determined at step C1), calculating the corrected value of fourth best down to the least best probability of correctness of the considered symbol using the parity check equation if two symbols are not assuming their values of best probability of correctness.

5. The method of claim 1, wherein the symbols comprise values of a non-binary Galois Field.

6. A decoder for decoding symbols of a word received through a communication channel and transmitted according to a LDPC code having at least one check node related to a parity check equation, the decoder generating a first output table of corrected values of the symbols, wherein each row of the first output table stores, in order, a most probable value down to a least probable value and each column of the first output table stores possible values of each symbol, and a second output table of a logarithm of a ratio between a respective probability of correctness of a values in the first output table and their corresponding maximum probability of correctness, by processing the components of a first input table of values of a Galois Field of symbols and of a second input table of a corresponding probability of correctness of each value, the decoder comprising:

processing circuitry configured to fill in a first row of the second output table by copying a first row of the first input table into a first row of the second output table, and fill in the first row of the first output table by computing a most likely symbol that satisfies the parity check equation;

determine probability values of a second row of the second output table for each symbol if one symbol different from a considered one of the received word is assuming its second best value, and determine a corresponding corrected value in the first output table by applying the parity check equation;

determine probability values of a third row of the second output table for each symbol if one symbol different from a considered one of the received word is assuming a value different from its most probable value and a value previously considered in determining the probability values for the second output table, and determine a corresponding corrected value in the first output table by applying the parity check equation;

determine probability values of fourth and successive rows of the second output table for each symbol, by at least for each symbol, calculating a first probability value in a case that one symbol different from a considered one of the received word is assuming a value different from its most probable value and a value previously considered, and calculating a second probability value in a case that two symbols different from the considered one of the received word are not assuming their most probable values, and checking which of the first and second probability values is greater, and determining a corresponding corrected value in the first output table by applying the parity check equation; and outputting the first and second output tables.

7. The decoder of claim 6, wherein said processing circuitry is configured to fill in the second row of the first and second output tables by:

a1) identifying in the first and second input tables a symbol having a greatest second best probability of correctness;

a2) identifying in the first and second input tables a symbol different from the symbol having the second greatest second best probability of correctness;

a3) generating a corrected value of the second best probability of correctness of the symbol using the parity check equation if a value assumed by the symbol is the second best probability of correctness;

a4) generating corrected values of a second best probability of correctness of all symbols but the symbol using the parity check equation if a value assumed by the symbol is the second best probability of correctness; and a5) filling in the second row of the first output table with the corrected values of the second best probability of correctness of all symbols but the symbol using the parity check equation;

a6) filling in the second row of the second output table according to $M_{output}(2, a_1)=M_{input}(2, b_1)$, and $M_{output}(2, j)=M_{input}(2, a_1) \ \forall j \neq a_1$, where a1 is the symbol having the greatest second best probability of correctness, and where b1 is the symbol having the second greatest second best probability of correctness.

8. The decoder of claim 7, wherein said processing circuitry is configured to fill in third and successive rows of the first and second output tables by:

b1) for symbols that have been identified in a previously executed step, repeating a1), a3), a5) and a6), preventively discarding values of the first input table already taken into consideration for the same symbol;

b2) for the remaining symbols, repeating the operations a2), a4), a5) and a6) as for the symbol different from the symbol having the second greatest second best probability of correctness, discarding values of the first input table already taken into consideration for that same symbol; and b3) for each symbol, checking whether a calculated corrected value has been obtained for the same symbol in a previous step and, if not, repeating at least one of b1) and b2).

9. The decoder of claim 8, wherein said processing circuit is configured to, before calculating values of a fourth best down to a least probability of correctness of the symbols:

c1) determine a probability of correctness of a corrected value of the fourth best down to the least best probability of correctness of the considered symbol calculated using the parity check equation if one symbol is not assuming its value of best probability of correctness;

c2) determine the probability of correctness of the corrected value of fourth best down to the least best probability of correctness of the considered symbol calculated using the parity check equation if two symbols are not assuming their values of best probability of correctness; and c3) if the probability of correctness determined at C2) is greater than probability of correctness determined at step C1), calculate the corrected value of fourth best down to the least best probability of correctness of the considered symbol using the parity check equation if two symbols are not assuming their values of best probability of correctness.

10. The decoder of claim 6, wherein the symbols comprise values of a non-binary Galois Field.

11. A method of generating, for each check node related to a parity check equation of a LDPC code, a first output table of corrected values of symbols of a word transmitted according to the LDPC code, wherein each row of the first output table stores, in order, a most probable value down to a least probable value, and each column of the first output table stores possible values of each symbol, the method also for generating a second output table of a logarithm of a ratio between a respective probability of correctness of values of same coordinates in the first output table and their corresponding maximum probability of correctness, by processing components of a first input table and of a second input table of corresponding probability of correctness of each value, the method comprising:

filling in a first row of the second output table by copying a first row of the first input table into a first row of the second output table, and filling in the first row of the first output table by computing a most likely symbol that satisfies the parity check equation;

determining probability values of a second row of the second output table for each symbol if one symbol different from a considered one of the received word is assuming its second best value, and determining a corresponding corrected value in the first output table by applying the parity check equation;

determining probability values of a third row of the second output table for each symbol if one symbol different from a considered one of the received word is assuming a value different from its most probable value and a value previously considered in determining the probability values for the second output table, and determining a corresponding corrected value in the first output table by applying the parity check equation; and determining probability values of fourth and successive rows of the second output table for each symbol.

12. The method of claim 11, further comprising filling in the second row of the first and second output tables by:

a1) identifying in the first and second input tables a symbol having a greatest second best probability of correctness;

a2) identifying in the first and second input tables a symbol different from the symbol having the second greatest second best probability of correctness;

a3) generating a corrected value of the second best probability of correctness of the symbol using the parity check equation if a value assumed by the symbol is the second best probability of correctness;

a4) generating corrected values of a second best probability of correctness of all symbols but the symbol using the parity check equation if a value assumed by the symbol is the second best probability of correctness;

a5) filling in the second row of the first output table with the corrected values of the second best probability of correctness of all symbols but the symbol using the parity check equation; and a6) filling in the second row of the second output table according to $M_{output}(2, a_1)=M_{input}(2, b_1)$, and $M_{output}(2, j)=M_{input}(2, a_1) \ \forall j \neq a_1$, where a1 is the symbol having the greatest second best probability of correctness, and where b1 is the symbol having the second greatest second best probability of correctness.

13. The method of claim 12, further comprising filling in third and successive rows of the first and second output tables by:

b1) for symbols that have been identified in a previously executed step, repeating a1), a3), a5) and a6), preventively discarding values of the first input table already taken into consideration for the same symbol;

b2) for the remaining symbols, repeating the operations a2), a4), a5) and a6) as for the symbol different from the symbol having the second greatest second best probability of correctness, discarding values of the first input table already taken into consideration for that same symbol; and b3) for each symbol, checking whether a calculated corrected value has been obtained for the same symbol in a previous step and, if not, repeating at least one of b1) and b2).

* * * * *

UNITED STATES PATENT AND TRADEMARK OFFICE
CERTIFICATE OF CORRECTION

PATENT NO. : 8,543,889 B2
APPLICATION NO. : 13/171716
DATED : September 24, 2013
INVENTOR(S) : Mauro Natuzzi It is certified that error appears in the above-identified patent and that said Letters Patent is hereby corrected as shown below:

In the Claims:

| | |
|---|---|
| Column 17, Claim 3, Line 40 | Delete: "same symbol, b2) for the" Insert --same symbol;-- |
| Column 17, Claim 3, Line 41 | Delete: "remaining symbols," Insert --b2) for the remaining symbols,-- |
| Column 17, Claim 4, Line 64 | Delete: "C2)" Insert --c2)-- |
| Column 17, Claim 4, Line 66 | Delete: "C1)" Insert --c1)-- |
| Column 19, Claim 9, Line 48 | Delete: "C2)" Insert --c2)-- |
| Column 19, Claim 9, Line 50 | Delete: "C1)" Insert --c1)-- |

Signed and Sealed this
Twenty-seventh Day of May, 2014

Michelle K. Lee
*Deputy Director of the United States Patent and Trademark Office*